(12) United States Patent
Giebeler et al.

(10) Patent No.: US 9,857,880 B2
(45) Date of Patent: Jan. 2, 2018

(54) SWITCH OPERATING DEVICE, MOBILE DEVICE AND METHOD FOR OPERATING A SWITCH BY A PRESENCE OF A PART EMITTING HEAT

(71) Applicant: Pyreos Ltd., Edinburgh (GB)

(72) Inventors: Carsten Giebeler, Edinburgh (GB); Spyros Brown, Edinburgh (GB); Tim Chamberlain, Edinburgh (GB); Jonathan Ephraim David Hurwitz, Edinburgh (GB)

(73) Assignee: Pyreos Ltd., Edinburgh (GB)

( * ) Notice: Subject to any disclaimer, the term of this patent is extended or adjusted under 35 U.S.C. 154(b) by 0 days.

(21) Appl. No.: 14/950,076

(22) Filed: Nov. 24, 2015

(65) Prior Publication Data

US 2016/0077583 A1    Mar. 17, 2016

Related U.S. Application Data

(63) Continuation of application No. PCT/EP2014/060551, filed on May 22, 2014.
(Continued)

(51) Int. Cl.
*G06F 3/01* (2006.01)
*H03K 17/945* (2006.01)
(Continued)

(52) U.S. Cl.
CPC .............. *G06F 3/017* (2013.01); *G06F 3/012* (2013.01); *G06F 3/0308* (2013.01); *G06F 3/041* (2013.01); *H03K 17/945* (2013.01)

(58) Field of Classification Search
None
See application file for complete search history.

(56) References Cited

U.S. PATENT DOCUMENTS

2011/0050643 A1*  3/2011  Zhao ................... G06F 3/042
                                                    345/175

FOREIGN PATENT DOCUMENTS

WO       2012066562 A2    5/2012

OTHER PUBLICATIONS

International Search Report in counterpart International Application No. PCT/EP2014/060551, dated Aug. 8, 2014.
(Continued)

*Primary Examiner* — Kenneth B Lee, Jr.
(74) *Attorney, Agent, or Firm* — Edell, Shapiro & Finnan, LLC

(57) ABSTRACT

Switch operating device (100) with: a presence sensor operating a switch (103) in response to presence of a heat emitting part. The presence has an approach phase (31) during which the part approaches the presence sensor, a remaining phase during which the part remains proximate to the sensor, and a withdrawal phase (41) during which the part is moved away from the sensor. The sensor detects heat emitted by the part with at least one pixel and outputs a signal (51 to 54) with signal deflections (56, 57) corresponding to a temporal intensity curve of heat detected by the pixel. A signal processing unit (101) determines the approach and withdrawal phases from the temporal succession and the shape of the signal deflections. An actuator (104) is controlled by the signal processing unit and operates the switch when the approach phase, the remaining phase and/or the withdrawal phase is determined.

15 Claims, 3 Drawing Sheets

Related U.S. Application Data

(60) Provisional application No. 61/827,108, filed on May 24, 2013.

(51) Int. Cl.
  *G06F 3/03* (2006.01)
  *G06F 3/041* (2006.01)

(56) References Cited

OTHER PUBLICATIONS

Wojtczuk, P. et al., "Recognition of simple gestures using a PIR sensor array". Sensors & Transducers, International Frequency Sensor Association. vol. 14-1. Mar. 2012. pp. 83-94.

* cited by examiner

SWITCH OPERATING DEVICE, MOBILE DEVICE AND METHOD FOR OPERATING A SWITCH BY A PRESENCE OF A PART EMITTING HEAT

CROSS-REFERENCE TO RELATED APPLICATIONS

This application is a Continuation of International Application No. PCT/EP2014/060551, filed on May 22, 2014, which claims benefit under 35 U.S.C. §119(e) to U.S. Provisional Application No. 61/827,108, filed May 24, 2013. The disclosures of both related applications are considered part of and are incorporated by reference into the disclosure of the present application in their respective entireties.

FIELD OF THE INVENTION

The invention relates to a switch operating device, a mobile device with the switch operating device and a method for operating a switch with the switch operating device by a presence of a part emitting heat, in particular of a human head.

BACKGROUND

Interactive systems and their human being-machine-interfaces are known for the human being-computer-interaction, wherein the human being-machine-interfaces are provided with a device for the automatic recognition of non-tactile or tactile gestures performed by human beings. The gesture can principally be derived from every posture and every movement of the body. The gesture recognition device is provided with a device for the acquisition of the gesture, wherein the image information generated thereby is processed with corresponding algorithms in order to derive a gesture out of the information. For example, a mobile telephone is conventionally provided with the gesture recognition device such that with the gesture recognition device it can be detected if the mobile telephone is held at the head of a human being in order to activate, respectively deactivate an associated function of the mobile telephone for telephoning. The gesture recognition device of the mobile telephone for recognizing the presence of the human head is conventionally based on the optical acquisition of the surroundings of the mobile telephone, wherein the presence of the head is considered to be detected as soon as the head is optically acquired by the gesture recognition device. It is hereby to be taken into account that the human head is supposed to be distinguished from other human body parts approaching the mobile telephone, wherein disturbing influences from the surroundings, for example a change of the light conditions, have to be masked out. Further, it is difficult to provide the gesture recognition such that the accuracy during the detection of the presence of the human head is not influenced if the human being wears a cap or a hat or which haircut the human being has, in particular if the human being has long hair or is bald.

SUMMARY

It is an object of the invention to provide a switch operating device, a mobile device with the switch operating device and a method for operating a switch with the switch operating device by the presence of a part emitting heat, wherein the switch operating device has a miniaturized design with low costs and low energy consumption and the operation of the switch with the switch operating device is secure and has few errors.

The switch operating device according to the invention comprises a presence sensor for operating a switch by a presence on the presence sensor of a part emitting heat, wherein the presence is formed by an approach phase during which the part approaches the presence sensor, a remaining phase during which the part remains in the proximity of the presence sensor, and a withdrawal phase during which the part is to be moved away from the presence sensor, wherein the presence sensor is adapted to detect heat emitted by the part with at least one pixel comprising a thin film out of pyroelectric material and to output per pixel a signal with signal deflections according to the temporal intensity curve of the heat detected by the pixel, a signal processing unit with which the approach phase and the withdrawal phase can be determined from the temporal succession and the shape of the signal deflections, and an actuator that is controlled by the signal processing unit and operates the switch when the approach phase, the remaining phase and/or the withdrawal phase is determined. The pyroelectric material is preferably lead-zirconate-titanate.

The mobile device according to the invention comprises the switch operating device, wherein the switch is interconnected in the mobile device for activating/deactivating a functionality of the mobile device.

The method according to the invention for operating the switch operating device comprises: approaching the part emitting heat on the presence sensor so that the first signal deflection generated in the approach phase is output from the pixel to the signal processing unit, wherein the signal of the pixel is processed by the signal processing unit so that the first signal deflection is identified by the signal processing unit as a first absolute amplitude rise to a first extremum and, after elapsing a first duration from the beginning of the first absolute amplitude rise, a first absolute amplitude decay to an amplitude value which absolute value is between a first predetermined absolute value and the absolute value of the signal level that prevails during a non-affection of the pixel; when the first signal deflection was identified: controlling the actuator for operating the switch by the signal processing unit; from the identification of the first signal deflection: pausing the processing of the signal of the pixel by the signal processing unit for a predetermined waiting duration that forms the waiting phase; withdrawal of the part emitting heat from the approach sensor so that the second signal deflection generated in the withdrawal phase is output from the pixel to the signal processing unit, wherein the signal of the pixel is processed by the signal processing unit, so that the second signal deflection is identified by the signal processing unit as a second absolute amplitude rise to a second extremum and, after elapsing a second duration from the beginning of the second absolute amplitude rise, a second absolute amplitude decay to an amplitude value which absolute value is between a second predetermined absolute amplitude value and the absolute value of the signal level that prevails during a non-affection of the pixel; as soon as the second deflection is identified: controlling the actuator for operating the switch by the signal processing unit.

Since the pixel comprises the thin film made out of the pyroelectric material, in particular lead-zirconate-titanate, the pixel that is generated by the part emitting heat during the presence of the part in the proximity of the presence sensor is provided advantageously such that the recognition of the presence of the part emitting heat can be carried out securely and has few errors by the method according to the invention. Furthermore, the presence sensor with the pixel can be made in such a miniaturized design with low costs such that the switch operating device can advantageously be used for the mobile device. The signal is generated with the thin film by the heat emitted by the part so that the presence sensor does not need to be supplied with energy with an external energy source. The switch operating device therefore comprises the signal processing unit and the actuator as energy consumer so that the energy consumption of the switch operating device is advantageously altogether low for the mobile device.

The presence sensor preferably comprises at least two pixels. Therefore, two signals generated independently from each other are provided for the signal processing unit, wherein the processing of the signals and the recognition of the presence of the part emitting heat going along therewith is advantageously provided redundantly.

The part is preferably a human head and the heat emitted by the part is preferably the body heat radiated from the human head. The recognition of the presence of the human head in the framework of usual human motion sequences is enabled particularly securely and has few errors by the inventive and/or preferred embodiments of the switch operating device. Since the recognition of the presence of the human head is based on the detection of the body heat emitted by the human head, the signals used for the recognition of the presence of the head are almost uninfluenced for example from the type of the haircut of the human being or if the human being wears a head dress. Possible wrong operations of the switch are therefore prevented, wherein the wrong operations are for example caused by long hair or a cap.

The method for operating the switch operating device preferably comprises: verifying, if the absolute values of the amplitudes of the signal deflections are above a predetermined amplitude level; if the verification is positive, proceeding with the respective next step.

Further, it is preferred that the waiting duration is maximum five seconds. The first duration is preferably maximum between 10 ms and 1000 ms. It is furthermore preferred that the second duration is maximum between 10 ms and 1000 ms. The absolute value of the first predetermined amplitude value is preferably, in relation to the absolute amplitude value of the first extremum, maximum 20% to 50% higher than the absolute value of the signal level that prevails during a non-affection of the pixel. Further, the absolute value of the second predetermined amplitude value is, in relation to the absolute amplitude value of the second extremum, maximum 20% to 50% higher than the absolute value of the signal level that prevails during a non-affection of the pixel.

The method for operating the switch operating device further preferably comprises: verifying, if the first extremum is above and the second extremum is below the signal level that prevails during a non-affection of the pixel, or if the first extremum is below and the second extremum is above the signal level that prevails during a non-affection of the pixel; if the verification is positive, proceeding with the method. The approach sensor preferably comprises at least two pixels, wherein it is preferably verified, if the first signal deflections and the second signal deflections of the pixels respectively are within a predetermined duration; if the verification is positive, proceeding with the method. It is hereby preferred that the predetermined duration is 30 ms.

By the inventive and/or preferred embodiments of the method for operating the switch operating device it is advantageously achieved that noise signals that, for example, are released by influences from the surroundings of the presence sensor do not or almost not affect the processing by the processing signal unit, whereby the accuracy for the recognition of the presence of the part emitting heat and the operation of the switch is increased. By the inventive and/or preferred definition of the sequences of the signal deflections that are assigned to the presence of the part emitting heat, the accuracy for the recognition of the presence of the part emitting heat out of noise influences on the presence sensor is advantageously high, whereby a secure recognition of the presence of the part emitting heat is enabled, wherein the recognition has few errors. If, for example, the sequences of the signal deflections do not correspond to the signal deflections as they are defined for the presence of the part emitting heat, these signal deflections are not interpreted as a presence of the part emitting heat. By using the signal deflections generated by the thin film made out of the pyroelectric material, in particular lead-zirconate-titanate, for the identification of the presence of the part emitting heat, an increase of the precision of the recognition for the presence of the part emitting heat is achieved in a surprising manner.

BRIEF DESCRIPTION OF THE DRAWINGS

In the following a preferred embodiment of the invention is explained on the basis of schematic drawings, which show.

DETAILED DESCRIPTION

Figure 1:
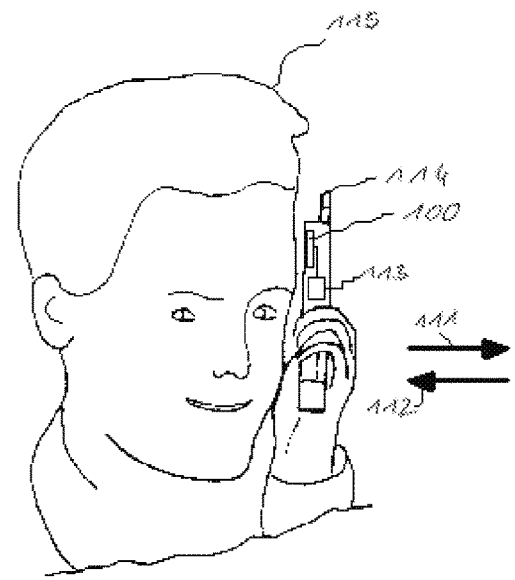
FIG. 1 a schematic illustration of a mobile telephone that is held on an ear of a human head, FIG. 2 a schematic illustration of a switch operating device according to the invention for the mobile telephone from FIG. 1, FIG. 3 a diagram with amplitude curves of signals of a presence sensor from FIGS. 1 and 2, and FIGS. 4 and 5 detailed views of FIG. 2.

A human being is shown in FIG. 1, wherein the human being holds a mobile telephone 114 at his head 115. The mobile telephone 114 was brought close to the head 115 with the hand by an approach movement 112, for example, for a telephone call. If the telephone call has ended, the mobile telephone 114 is withdrawn from the head 115 with a withdrawal movement 111. The mobile telephone 114 comprises a switch operating device 100 and a functioning unit 113 that can be activated and deactivated with the switch operating device 100. The functioning unit 113 is for example an illumination device for a display of the mobile telephone 114, wherein the illumination device is switched by the switch operating device 100 such that the illumination device is deactivated as long as the mobile telephone 114 is held on the head 115.

The mobile telephone 114 is for example switched on, lies on a table and has sufficient reception for receiving telephone calls. In case a telephone call comes in, the mobile telephone 114 rings and the illumination device is switched on for illuminating the display of the mobile telephone 114. If the human being takes the mobile telephone 114 with the hand and leads it to his head 115 in order to hold the telephone call after taking it, the human being holds the mobile telephone 114 at his ear. As soon as the mobile telephone 114 is in the proximity of the head 115, the switch operating device 100 deactivates the illumination device in order to decrease the energy consumption of the mobile telephone 114 and not to unnecessarily illuminate the head 115 with the illumination device.

Figure 2:
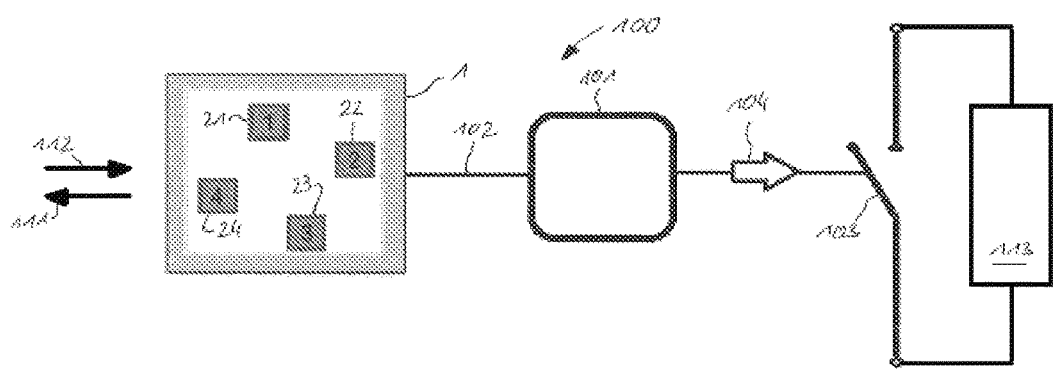

As shown in FIG. 2, the switch operating device 100 comprises a presence sensor 1 with which it is detected that the mobile telephone 114 is held closely to the head 115. The presence sensor 1 is interconnected via a signal line 102 with a signal processing unit 101 in which signals transferred from the presence sensor 1 to the signal processing unit 101 are processed. Once the presence of the head 115 in the proximity of the mobile telephone 114 is determined by the signal processing in the signal processing unit 101, a switch 103 is operated via an actuator 104. The functioning unit 113 can be activated and deactivated with the switch 103.

The presence sensor 1 comprises a first pixel 21, a second pixel 22, a third pixel 23 and a fourth pixel 24. The pixels 21 to 24 respectively comprise a thin film out of lead-zirconate-titanate, with which a respective signal 51 to 54 is generated, as soon as heat emitted by the head 115 is detected by the respective pixel 21 to 24. One of the signals 51 to 54 is output from each pixel 21 to 24 to the signal processing unit 101 for example by the presence of the head 115 in the proximity of the presence sensor 1. The curves of the signals 51 to 54 are analogue and correspond to the temporal intensity curves of the heat emitted by the head 115, wherein the heat is acquired by the thin films of the pixels 21 to 24.

Figure 3:
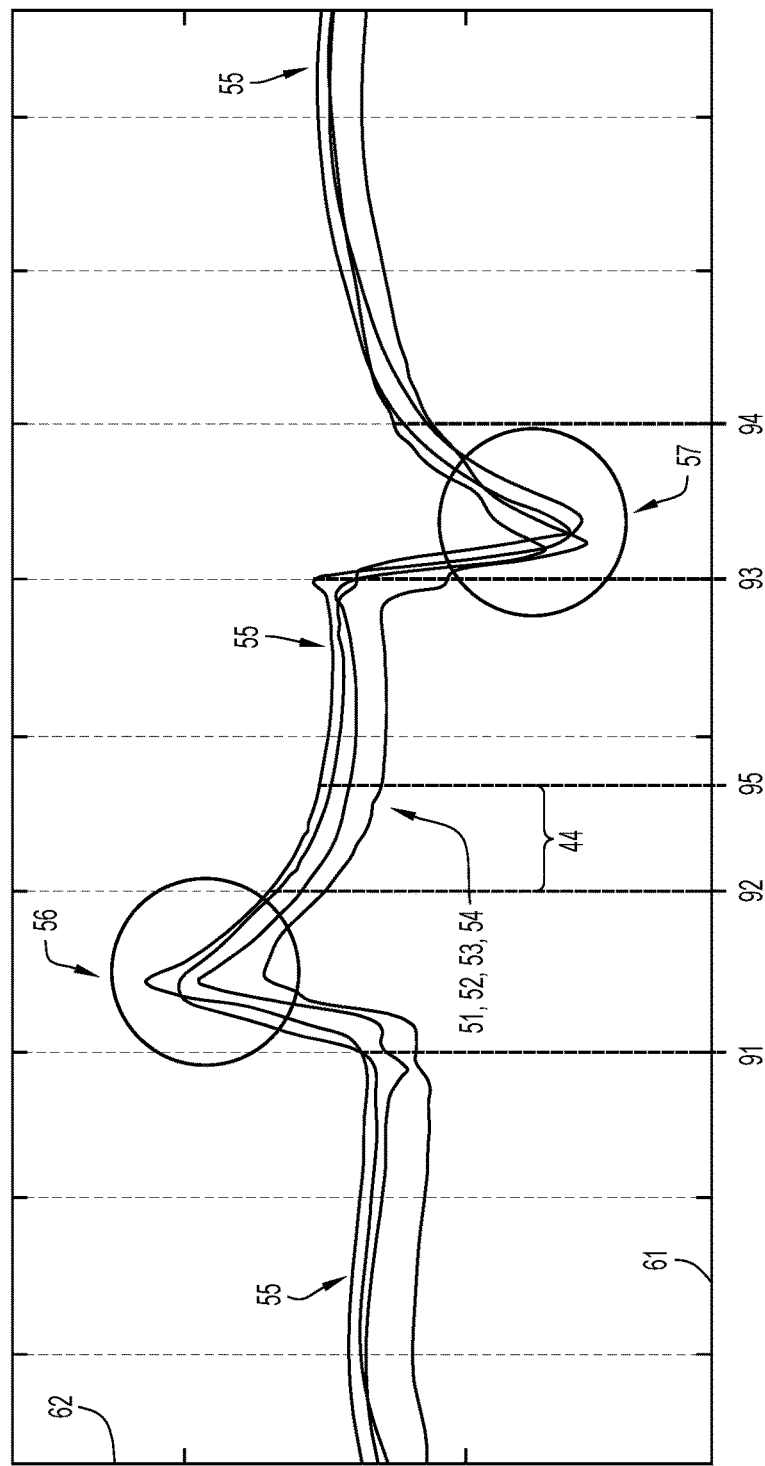
Figure 4:
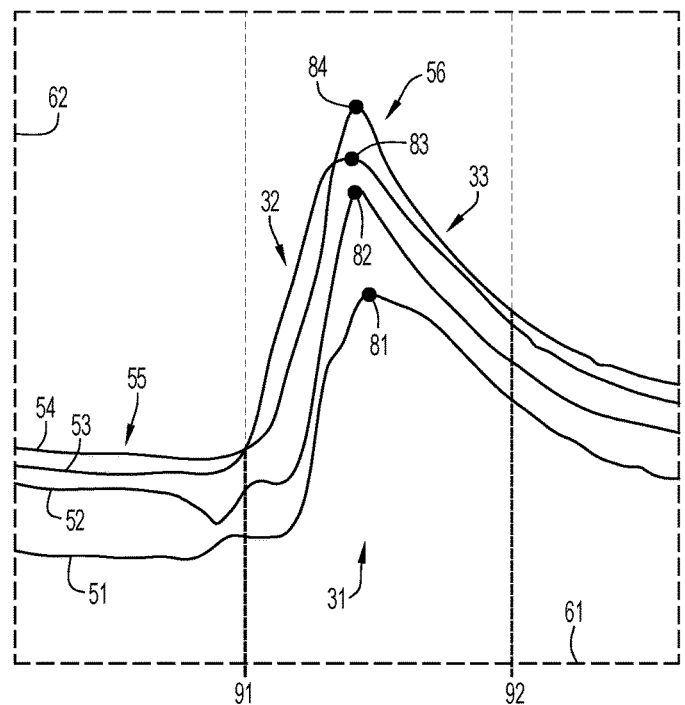
Figure 5:
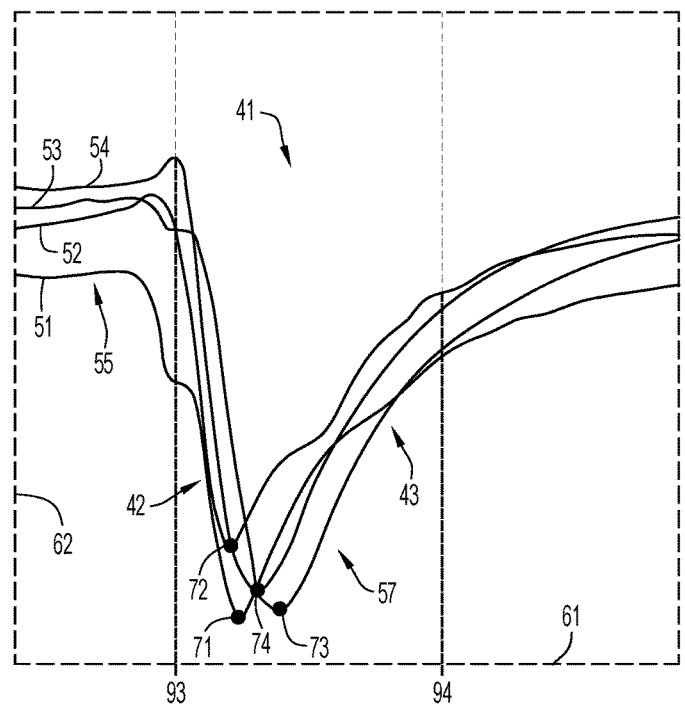

In FIGS. 3 to 5 a respective diagram is shown over which ordinate 61 the time is plotted and over which abscissa 62 the amplitudes of the signals 51 to 54 of the pixels 21 to 24 are plotted. The temporal curve of the signals 51 to 54 is substantially congruent. In the signals 51 to 54, a respective approach phase 31 generated by the approach movement 112 is to be recognized, wherein the approach phase 31 leads to a first signal deflection 56 for the signals 51 to 54. The first signal deflection 56 is composed of a first absolute amplitude rise 32 and a first absolute amplitude decay 33. The first absolute amplitude rise 32 begins at a start point in time 91 and the first absolute amplitude decay 33 ends at a first end point in time 92, wherein each signal 51 to 54 comprises a respective maximum 81 to 84 during transition from the first absolute amplitude rise 32 to the first absolute amplitude decay 33.

A second signal deflection 57 of the signals 51 to 54 is caused in an analogous manner by the withdrawal movement 111, wherein the second signal deflection 57 comprises a withdrawal phase 41 that is formed by a second absolute amplitude rise 42 and a second absolute amplitude decay 43. The withdrawal phase 41 of the signals 51 to 54 respectively comprises a minimum 71 to 74. The signal deflections 56, 57 are directed opposite so that according to FIGS. 2 and 3, the first signal deflection 56 points upwards and according to FIGS. 2 and 4, the second signal deflection 57 points downwards. The start point in time of the second signal deflection 57 is denoted with the reference sign 93 and the end point in time of the second signal deflection 57 is denoted with the reference sign 94.

The signal deflections 56 and 57 are caused by the pixels 21 to 24 due to the dynamic of the approach movement 112 and the withdrawal movement 111, whereas pixel passivity of the pixels 51 to 54 is present when the head 115 is not present in the proximity of the presence sensor 1 or when the mobile telephone 114 is kept still on the head 115, wherein the signal level of the pixel passivity is denoted with the reference sign 55. The absolute amplitude values of the signals output by the pixels 21 to 24 are very low during the pixel passivity, so that in the ideal case, it can be assumed that the signal level 55 is zero.

The switch operating device 100 is interconnected such that signals 51 to 54 of the pixels 21 to 24 are permanently output to the signal processing unit 101. The signals 51 to 54 are processed in real time in the signal processing unit 101 such that, if a temporal succession of the signal deflections 56 and 57 is present. If the first signal deflection 56 is determined by the signal processing unit 101, the actuator 104 is operated by the signal processing unit 101 such that the switch 103 is opened, so that the functioning unit 113, for example the display of the mobile telephone 114, is switched off. As soon as the end point in time 92 of the first signal deflection 56 is determined in the signal processing unit 101, a waiting phase 44 starts, wherein the waiting phase 44 ends at an end point in time 95, wherein during the waiting phase 44 the processing of the signals 51 to 54 by the signal processing unit 101 is shut down. The second signal deflection 57 is expected by the signal processing unit 101 only after reaching the end point in time 95 of the waiting phase 44. As soon as the signal processing unit 101 detects the second signal deflection 57 from among the signals 51 to 54, the switch 103 is closed via the actuator 104, so that the functioning unit, for example the display of the mobile telephone 114, is again switched on.

For example a signal deflection in shape of the second signal deflection 57 that occurs during the waiting phase 44 immediately after the first signal deflection 56 is not identified as the second signal deflection 57 by means of the waiting phase 44, during which the signal processing of the signal processing unit 101 is shut down. It is therefore prevented that a short succession of signal deflections that for example are generated by disturbing influences of the surroundings is wrongly identified as the presence of the mobile telephone 114 on the head 115.

During detecting the presence of the mobile telephone 114 on the head 115 it is to proceed in detail as following:

Since the mobile telephone 114 is brought to the head 115 with the approach movement 112 during the approach phase 31, an increase of heat emitted by the head 115 is detected by the pixels 21 to 24 of the presence sensor 1. The first signal deflection 56 is therefore respectively output by the pixels 21 to 24 and is identified by the signal processing unit 101, namely as the first absolute amplitude rise 32 to the respective maximum 81 to 84 and, after elapsing the duration between the start point in time 91 and the end point in time 92 of the first signal deflection 56, the first absolute amplitude decay 33 to a first amplitude value. The first amplitude value is supposed to be, in relation to the maximum 81 to 84, maximum 20% to 50% higher as the amplitude value of the signal level 55 that prevails during the non-affection of the pixels 21 to 24. The duration between the start point in time 91 and the end point in time 92 of the first signal deflection 56 is supposed to be maximum between 20 ms and 50 ms.

Once the first signal deflection is identified by the signal processing unit 101, the actuator 104 is controlled for operating the switch 103. From the identification of the first signal deflection 56 by the signal processing unit 101, meaning after elpase of the first end point in time 92 of the first signal deflection 56, the processing of the signals 51 to 54 by the signal processing unit 101 is stopped during the waiting phase 44 that is supposed to be between two seconds and five seconds. After the end point in time 95 of the waiting phase 44, the signal processing unit 101 recommences the processing of the signals 51 to 54. Should the mobile telephone 114 be withdrawn from the head 115 with the withdrawal movement 111 during the waiting phase 44, the signal processing unit 101 will not be able to identify an expected second signal deflection 57. Such a short presence of the mobile telephone 114 at the head 115 is not identified as the presence for which the switch operating device 100 is adapted to detect the presence of the mobile telephone 114 at the head 115.

Once the first signal deflection 56 is detected by the signal processing unit 101 and the waiting phase 44 has ended, the signal processing unit 101 is in a state during which the signal processing unit 101 is ready to identify the second signal deflection 57 by processing the signals 51 to 54. In case the second signal deflection 57 is not identified by the signal processing unit 101 after elapsing a predetermined duration, the signal processing unit 101 is set back in its original state, during which the signal processing unit 101 is ready to again identify the first signal deflection 56.

However, if the second signal deflection 57 can be identified out of the signals 51 to 54 by the signal processing unit 1 before elapsing this predetermined duration, since the mobile telephone 114 was withdrawn from the head 115 with the withdrawal movement 111, the actuator 104 is controlled by the signal processing unit 101 for operating the switch 103. The second signal deflection 57 is composed of the second absolute amplitude rise 42 to respectively one of the minima 71 to 74 and, after elapsing the duration between the start point in time 93 and the end point in time 94 of the second signal deflection 57, the second absolute amplitude decay 43 to a second amplitude value that is supposed to be, in relation to the minimum 71 to 74, maximum 20% to 50% below the signal level 55 that prevails during the non-affection of the pixels 21 to 24, wherein the duration is supposed to be maximum between 20 ms and 50 ms.

The first signal deflection 56 is identified by the signal processing unit 101 as such, only when the first amplitude value after the first absolute amplitude decay 33 is maximum 20% to 50% of the amplitude difference between the signal level 55 and the amplitude value in the maximum 81 to 84 above the signal level 55. Further, the second signal deflection 57 is identified by the signal processing unit 101 as such, only when the second amplitude value after the second absolute amplitude decay 43 is maximum 20% to 50% of the amplitude difference between the signal level 55 and the amplitude value in the maximum 81 to 84 above the signal level 55.

It is additionally verified, if the absolute values of the amplitudes of the signal deflections 56, 57 are above a predetermined absolute level, whereby noise influences out of the surroundings of the presence sensors 1 are supposed to be masked out. For the identification of the signal deflections 56 and 57 it is furthermore verified, if the maxima 81 to 84 are above and the minima 71 to 74 are below the signal level 55 that prevails during the non-affection of the pixels 21 to 24. With a corresponding opposite interconnection of the pixels 21 to 24, it is alternatively conceivable that it is verified, if the orientation of the signal deflections 56 and 57 are opposite to the orientation as they are shown in FIG. 2. It is furthermore verified, if respectively the maxima 81 to 83 and the minima 71 to 74 are within a predetermined duration that is 30 ms. It is therefore achieved that the presence of the mobile telephone 114 on the head 115 is only then detected, when all pixels 21 to 24 output the same signal quality of its signals 51 to 54 to the signal processing unit 101.

LIST OF REFERENCE SIGNS 1 presence sensor
21 first pixel
22 second pixel
23 third pixel
24 fourth pixel
31 approach phase
32 first absolute amplitude rise
33 first absolute amplitude decay
41 withdrawal phase
42 second absolute amplitude decay
43 second absolute amplitude rise
44 waiting phase
51 signal of the first pixel
52 signal of the second pixel
53 signal of the third pixel
54 signal of the fourth pixel
55 signal level during pixel passivity
56 first signal deflection during approach phase
57 second signal deflection during withdrawal phase
61 ordinate: time
62 abscissa: amplitude
71 first minimum
72 second minimum
73 third minimum
74 fourth minimum
81 first maximum
82 second maximum
83 third maximum
84 fourth maximum
91 start point in time of the signal deflection during approach phase
92 end point in time of the signal deflection during approach phase
   start point in time waiting phase
93 start point in time of the signal deflection during withdrawal phase
94 end point in time of the signal deflection during withdrawal phase
95 end point in time of waiting phase
100 switch operating device
101 signal processing unit
102 signal line
103 switch
104 actuator
111 withdrawal movement
112 approach movement
113 function unit
114 mobile telephone
115 head

What is claimed is:

1. A switch operating device comprising:
   a presence sensor adapted to operate a switch in response to presence on the presence sensor of a heat emitting part, wherein the presence includes an approach phase during which the part approaches the presence sensor, a remaining phase during which the part remains in proximity of the presence sensor, and a withdrawal phase during which the part is moved away from the presence sensor, wherein the presence sensor is adapted to detect heat emitted by the part with at least one pixel comprising a thin film that comprises pyroelectric material and to output per pixel a signal with signal deflections indicative of a temporal intensity curve of the heat detected by the pixel,
   a signal processing unit with which each of the approach phase and the withdrawal phase is determined from the temporal succession and a shape of the signal deflections, and an actuator controlled by the signal processing unit and adapted to operate the switch when the approach phase and/or the withdrawal phase is determined.

2. The switch operating device according to claim 1, wherein the pyroelectric material is lead-zirconate-titanate.

3. The switch operating device according to claim 1, wherein the presence sensor comprises at least one further pixel.

4. The switch operating device according to claim 1, wherein the part is a human head and the heat emitted by the part is the body heat radiated from the human head.

5. A mobile device having a switch operating device according to claim 1, wherein the switch is interconnected in the mobile device to alternately activate and deactivate a functionality of the mobile device.

6. A method for operating a switch operating device according to claim 1, comprising:
    outputting the first signal deflection generated in the approach phase from the pixel to the signal processing unit in response to approach of the heat emitting part to the presence sensor, wherein the signal of the pixel is processed by the signal processing unit, such that the first signal deflection is identified by the signal processing unit as a first absolute amplitude rise to a first extremum and, after elapse of a first duration from a beginning of the first absolute amplitude rise, a first absolute amplitude decay to an amplitude value, an absolute value of which is between a first predetermined absolute value and the absolute value of the signal level that prevails during a non-affection of the pixel
    controlling the actuator to operate the switch via the signal processing unit when the first signal deflection is identified;
    pausing the processing of the signal of the pixel by the signal processing unit for a predetermined waiting duration that forms the waiting phase when the first signal deflection is identified;
    outputting the second deflection generated in the withdrawal phase from the pixel to the signal processing unit in response to withdrawal of the heat emitting part from the presence sensor, wherein the signal of the pixel is processed by the signal processing unit, such that the second signal deflection is identified by the signal processing unit as a second absolute amplitude rise to a second extremum and, after elapse of a second duration from a beginning of the second absolute amplitude rise, a second absolute amplitude decay to an amplitude value, an absolute value of which is between a second predetermined absolute amplitude value and the absolute value of the signal level that prevails during a non-affection of the pixel;
    controlling the actuator to operate the switch via the signal processing unit.

7. The method according to claim 6, further comprising:
    proceeding with the method if the absolute values of the amplitudes of the signal deflections are above a predetermined amplitude level.

8. The method according to claim 6, wherein the waiting duration is between 0 s and 5 s.

9. The method according to claim 6, wherein the first duration is at most between 10 ms and 1000 ms.

10. The method according to claim 6, wherein the second duration is at most between 10 ms and 1000 ms.

11. The method according to claim 6, wherein the first predetermined absolute amplitude value is, in relation to the absolute amplitude value of the first extremum, at most 20% to 50% higher than the absolute value of the signal level that prevails during a non-affection of the pixel.

12. The method according to claim 1, wherein the second predetermined absolute amplitude value is, in relation to the absolute amplitude value of the second extremum, at most 20% to 50% higher than the absolute value of the signal level that prevails during a non-affection of the pixel.

13. The method according to claim 6, further comprising:
    proceeding with the method if the first extremum is above and the second extremum is below the signal level that prevails during a non-affection of the pixel, or if the first extremum is below and the second extremum is above the signal level that prevails during a non-affection of the pixel.

14. The method according to claim 6, wherein the presence sensor comprises at least one further pixel, further comprising:
    proceeding with the method if the first signal deflections and the second signal deflections of the pixels respectively are within a predetermined duration.

15. The method according to claim 14, wherein the predetermined duration is 30 ms.

* * * * *